(12) United States Patent
Magliocco (10) Patent No.: US 7,003,697 B2
(45) Date of Patent: **\*Feb. 21, 2006**

(54) APPARATUS HAVING PATTERN SCRAMBLER FOR TESTING A SEMICONDUCTOR DEVICE AND METHOD FOR OPERATING SAME

(75) Inventor: Paul Magliocco, Los Gatos, CA (US)

(73) Assignee: Nextest Systems, Corporation, San Jose, CA (US)

( \* ) Notice: Subject to any disclaimer, the term of this patent is extended or adjusted under 35 U.S.C. 154(b) by 376 days.

This patent is subject to a terminal disclaimer.

(21) Appl. No.: 10/039,738

(22) Filed: Jan. 4, 2002

(65) Prior Publication Data

US 2003/0005359 A1    Jan. 2, 2003

Related U.S. Application Data

(60) Provisional application No. 60/302,464, filed on Jul. 2, 2001.

(51) Int. Cl.
*G06F 11/00*    (2006.01)
(52) U.S. Cl. ......................................... 714/25; 714/734
(58) Field of Classification Search .................. 714/25, 714/30, 733, 734, 735, 738
See application file for complete search history.

(56) References Cited

U.S. PATENT DOCUMENTS

| | | | | |
|---|---|---|---|---|
| 4,807,229 A | * | 2/1989 | Tada | .......................... 714/739 |
| 5,101,153 A | * | 3/1992 | Morong, III | ................. 324/537 |
| 5,230,003 A | * | 7/1993 | Dent et al. | ................... 714/794 |
| 5,463,638 A | * | 10/1995 | De Lange | .................... 714/728 |
| 5,504,760 A | * | 4/1996 | Harari et al. | ............... 714/763 |
| 5,852,618 A | * | 12/1998 | Fujisaki | ...................... 714/738 |
| 5,930,271 A | * | 7/1999 | Takahashi | ................... 714/738 |
| 6,073,263 A | * | 6/2000 | Arkin et al. | ................. 714/738 |
| 6,094,738 A | * | 7/2000 | Yamada et al. | ............. 714/738 |
| 6,591,385 B1 | * | 7/2003 | Krech et al. | ................. 714/718 |
| 6,601,205 B1 | * | 7/2003 | Lehmann et al. | ........... 714/741 |
| 6,754,868 B1 | * | 6/2004 | Bristow et al. | ............. 714/744 |

OTHER PUBLICATIONS

Virgil P. Labuda et al. , "DFT Standards Allow Optimized Tester Configuration to Reduce Cost of Test", The Second Annual IEEE ASIC Seminar and Exhibit. Sep. 25-28, 1989. Rochester Riverside Convention Center, Rochester, New York. IEEE Catalog # 89TH0280-8.

\* cited by examiner

*Primary Examiner*—Dieu-Minh Le
(74) *Attorney, Agent, or Firm*—Dorsey & Whitney LLP (57) ABSTRACT

A system and method are provided for testing electronic devices. Generally, the system includes: (i) a pattern memory with outputs for storing and outputting bits to the device; and (ii) a pattern scrambler for coupling bits from the outputs to pins on the device to provide a test pattern to the device having a width of from 1 bit to a width equal to the number of outputs. Preferably, the system includes a clock with a clock cycle, and the scrambler can change the width and/or depth of the test pattern on a cycle-by-cycle basis More preferably, the scrambler can change the bits coupled to one or more of the pins on a cycle-by-cycle basis. In one embodiment, the memory simultaneously provides logic vector memory and scan memory for storing logic and scan vectors respectively, and the width/depth of the vectors can be changed on a cycle-by-cycle basis.

23 Claims, 9 Drawing Sheets

APPARATUS HAVING PATTERN SCRAMBLER FOR TESTING A SEMICONDUCTOR DEVICE AND METHOD FOR OPERATING SAME

CROSS REFERENCE TO RELATED APPLICATION

This application claims priority from U.S. Provisional Patent Application Ser. No. 60/302,464, entitled a SEMICONDUCTOR TEST SYSTEM HAVING VECTOR SCRAMBLING, filed Jul. 2, 2001.

FIELD OF INVENTION

This invention pertains generally to systems and apparatuses for testing integrated circuits (ICs), and more particularly to a test system having a pattern generator with a pattern memory and pattern scrambler for efficient high speed testing of ICs having logic circuits, memory arrays or both, and a method for using the same.

BACKGROUND

Automated or automatic test systems are widely used by manufacturers in the electronic industry to test various devices, including electronic components and integrated circuits (ICs), to cull defective devices before they are incorporated in products. Broadly, there are three types of digital devices that are commonly tested using automated test systems, those having memory arrays or circuits, such as flash memory or random access memories (RAM), those having logic circuits, such as processors, application specific ICs (ASICs) and programmable logic devices (PLDs), and those having both memory circuits and logic circuits. Generally, it is desirable to test the devices at several points during the manufacturing process, including while they are still part of a wafer or substrate, after dicing but before they are packaged, and after packaging the devices but before they are mounted or assembled on modules, cards or boards. This repetitive testing imposes demands on automated test systems to perform tests at high speed and with a high degree of accuracy. Moreover, the trend in the electronics industry has been to further increase the miniaturization of electronic devices and circuits, thereby allowing for an increase in the complexity of the devices. As the devices become more complex, the complexity of the test systems and their cost increase correspondingly.

Figure 1:
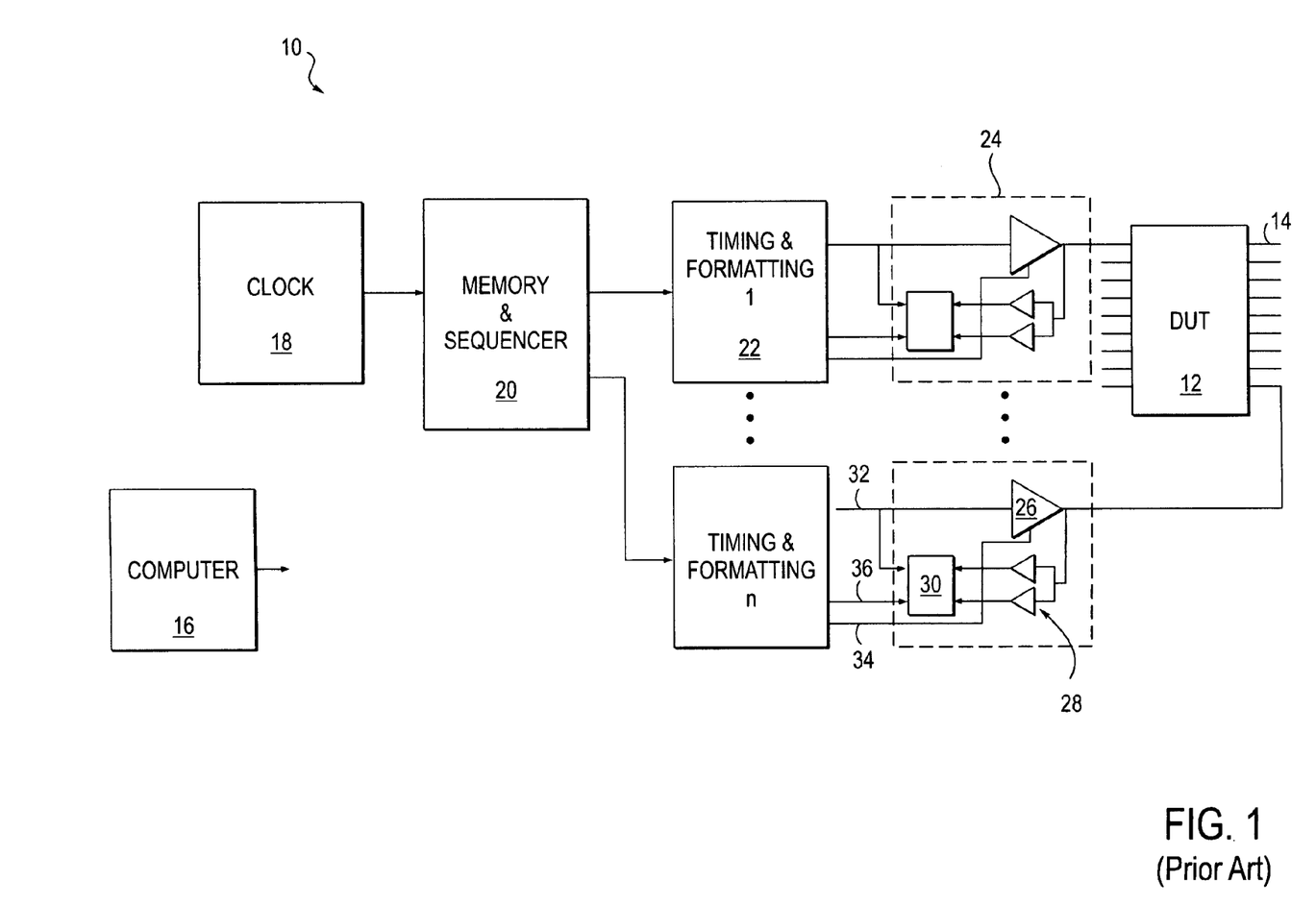
FIG. 1 (prior art) is a block diagram of a conventional test system for testing integrated circuits.

FIG. 1 illustrates an exemplary part of a conventional test system 10 for testing a device, commonly known as a Device Under Test or DUT 12, having a number of pins 14. Referring to FIG. 1, the test system 10 typically includes a general purpose computer 16 or personal computer (PC), a clock 18, a memory and sequencer 20 having a pattern memory and sequencing circuit, a number of timing and format circuits (T/Fs 22), and a number of pin electronics or PE channels 24. Generally, the test system 10 includes one T/F 22 and an associated P/E channel 24 for each pin 14 on the DUT 12, shown here as having pins 1 through n. The computer 16 loads test signals or patterns, commonly known as test vectors, into the memory and sequencer 20 and controls operation of other components of the test system 10. The clock 18 has a clock cycle and generates system clocks or clock signals and the test system period, both of which are provided to the memory and sequencer 20, the T/Fs 22, and other pipeline circuits in the test system 10. The memory and sequencer 20 stores and sequences test vectors used during the testing process. Commonly, the memory of the memory and sequencer 20 is either logic vector memory (LVM) which stores logic vectors, scan memory, which store scan vectors, or both. The T/Fs 22 adjust the timing and formatting of various signals of the test vectors, i.e., data, strobe and input/output (I/O) control signals, received from the memory and sequencer 20 and couple the output from the memory and sequencer to the DUT 12, through PE channels 24.

Each PE channel 24 typically includes a PE driver 26 for applying a test vector or data, to a pin 14 of the DUT 12, a comparator 28 for comparing a signal output from the DUT with an expected output signal, and an error logic circuit 30 for coupling results of the comparison back to error processing circuitry and an error capture memory (not shown). Generally, the PE driver 26 and the comparator 28 are not active in the same PE channels 24 at the same time, since pin 14 is either receiving data or control signals or transmitting a result at a given time. The PE channels 24 further include a data line 32 for coupling the test vectors from the T/F 22 to the PE driver 26 and to the error logic 30, an enable or control line 34 for enabling the PE driver to apply the test vector to the DUT 12, and a strobe line 36 for enabling the error logic 30.

A fundamental problem with the above test system 10 is that LVM and scan memory are typically expensive resources in automatic test systems. Moreover, conventional test systems typically only have a limited depth or amount of LVM available on each PE channel or pin on the DUT and, if available, a fixed width scan memory also having a limited depth dedicated to a fixed number of the PE channels or pins. The depth of these memories is important because as DUTs grow in density they require more and larger test vectors using more pattern memory.

Another problem with the above test system 10, related to the above problem, is its inability to vary the widths and depths of the LVM and scan memories without extensive re-wiring of the hardwiring of connection between the memory and sequencer 20 and the PE channels. Furthermore, this inability to vary the widths and depths of the LVM and scan memories results in inefficiency in the utilization of test system resources. That is, conventional test system 10 cannot vary the ratio of width to depth, the aspect ratio, of available pattern memory. For example, in a test system 10 designed to accommodate 64 pin devices, LVM outputs maybe mapped to 32 of the available PE channels to accommodate a 32-bit wide test vector. However, the depth or size of the test vector will be limited by the depth or size of the LVM. Moreover, even if the test system 10 is used to test a device having fewer than 64 pins and requiring only 16-bit wide test vectors, the unused portion of the LVM corresponding to the unused LVM outputs cannot be used to increase the memory available for the 16-bit wide test vectors.

Yet another problem with the test system 10 described above, is the inability to route any output from the memory and sequencer 20 to any PE channel 24, and therefore to any pin 14 on the DUT 12, limiting the flexibility and pattern memory depth when parallel testing multiple DUTs on a test site.

Still another problem with the conventional test system 10 described above is its inability to clock or change the test pattern applied to a DUT 12 at a rate greater than once in a clock-cycle.

Accordingly, there is a need for a test system and method of using the same that increases the efficiency and utilization of test system resources by maximizing the available storage space in pattern memory for a test vector of a given width. There is a further need for a system and method that enables the aspect ratio of available pattern memory to be tailored based on a width of required test vectors. There is yet a further need for a system and method capable of routing any output from the pattern memory to any PE channel. There is a still further need for a system and method capable of changing the test vector applied from any output from the pattern memory to any PE channel at a rate greater than once in a clock cycle.

The system and method of the present invention provides these and other advantages over the prior art.

SUMMARY

The present invention provides a test system having logic vector memory (LVM) and scan memory with fully programmable widths and depths, and a method for using the same to increase utilization of test system resources.

In one aspect, the invention is directed to a pattern generator for testing a device under test (DUT). Generally, the pattern generator comprises: (i) a pattern memory for storing a number of bits for testing the DUT, the pattern memory having a number of outputs for outputting the bits to test the DUT; and (ii) a pattern scrambler coupled between the outputs and a number of pins on the DUT, the pattern scrambler capable of being programmed to couple bits from one or more of the outputs to one or more of the pins on the DUT, to provide a test pattern to the DUT having a width of from 1 bit wide to a width equal to the number of outputs or the pins on the DUT. Preferably, the pattern memory has n outputs and a capacity of m×n bits, and the pattern scrambler is capable of being programmed to provide test patterns having depths of from n×m bits with a width of 1 bit to depths of m bits with a width of n bits. More preferably, the pattern generator is part of a test system further comprising a clock having a clock cycle, and the pattern scrambler is able to change the width, the depth, or both of test patterns provided to the DUT on a cycle-by-cycle basis for each clock cycle of the test system.

In one embodiment, the pattern scrambler is capable of coupling bits from any one of the outputs to any one of the pins on the DUT. In one version of this embodiment, the pattern generator is part of a test system having a clock with a clock cycle, the pattern scrambler is capable of changing bits coupled to one or more of the pins on the DUT on a cycle-by-cycle basis for each clock cycle of the test system.

In another embodiment, the pattern memory is capable of being operated, partitioned or divided to simultaneously provide a logic vector memory (LVM) and a scan memory for storing, respectively, logic vectors and scan vectors each including a number of bits and having a width and a depth. Preferably, the logic vectors stored in the LVM and the scan vectors stored in the scan memory need not have the same width and/or depth. Typically, the logic vectors stored in LVM are wide, often equal to the number of pins on the DUT. Scan memory is usually narrower, often only as wide as a few pins. More preferably, pattern generator is part of a test system having a clock with a clock cycle, and the width and/or depth of the logic vector and the scan vector can be changed "on the fly" on a cycle-by-cycle basis as noted above.

In yet another embodiment, the pattern generator is part of a test system having a clock with a clock cycle, and the pattern scrambler is capable of switching or changing any one of the outputs, and the bits output therefrom, coupled to any one of the pins on the DUT at least twice in each clock cycle to provide test patterns to the DUT at a rate at least twice that of the clock cycle.

In another aspect, the invention is directed to a method for testing a device under test (DUT) using a test system having a pattern memory with a number of outputs for outputting a number of bits to test the DUT, and a pattern scrambler coupled between the outputs and a number of pins on the DUT. In the method, bits for testing the DUT are stored in the pattern memory, and the pattern scrambler programmed or operated to couple bits from one or more of the outputs to one or more of the pins on the DUT, thereby providing a test pattern to the DUT. Generally, the test pattern can have a width of from 1 bit to a width equal to the number of the outputs or the pins on the DUT. Preferably, the pattern memory has n outputs and a capacity of m×n bits, and the step of programming the pattern scrambler involves programming the pattern scrambler to provide test patterns having a depth of from n×m bits with a width of 1 bit to a depth of m bits with a width of n bits. More preferably, the test system further includes a clock having a clock cycle, and the step of programming the pattern scrambler encompasses programming the pattern scrambler to change at least one of the width or the depth of the test patterns provided to the DUT on a cycle-by-cycle basis for each clock cycle of the test system.

In one embodiment, in which the test system further includes a clock having a clock cycle, and in which the pattern scrambler is capable of coupling bits from any one of the outputs to any one of the pins on the DUT, the step of programming the pattern scrambler involves programming the pattern scrambler to switch or change bits coupled to one or more of the plurality of pins on the DUT on a cycle-by-cycle basis for each clock cycle of the test system. Optionally, the pattern scrambler can be programmed to switch bits from any one of the outputs coupled to any one of the pins on the DUT at least twice in each clock cycle, thereby providing test patterns to the DUT at a rate at least twice that of the clock cycles.

In another embodiment, the pattern memory is capable of being operated, divided or partitioned to simultaneously provide a logic vector memory (LVM) and a scan memory. In this embodiment, the step of storing a number of bits in the pattern memory for testing the DUT involves storing in the LVM logic vectors with a number of bits and having a width and a depth, and storing in the scan memory scan vectors with a number of bits and having a width and a depth In one version of this embodiment, the logic vectors stored in the LVM and the scan vectors stored in the scan memory need not have the same width and/or depth.

In another embodiment, the pattern scrambler has the ability to split the three bits delivered per DUT pin to two or more different pins, allowing one DUT pin or pins to act in the drive mode and the other DUT pin or pins to act in the receive mode, as is common in scan testing where pins are typically dedicated as scan-in pins or scan-out pins and do not change input/output (I/O) state on a cycle-by-cycle basis. In this mode of operation, the Strobe Control bit function is unchanged, but the I/O Control bit changes function and is used as an Expect Data bit for the error logic. Using this scheme maximizes the usage of the LVM and scan memory, especially when scan-in DUT pins are equal in number to scan-out DUT pins, which is the typical case.

BRIEF DESCRIPTION OF THE DRAWINGS

These and various other features and advantages of the present invention will be apparent upon reading of the following detailed description in conjunction with the accompanying drawings, where.

DETAILED DESCRIPTION

The present invention is directed to a system and method for efficient and high speed testing of Integrated Circuits (ICs) using a test system having a pattern generator with a pattern memory and pattern scrambler.

Figure 2:
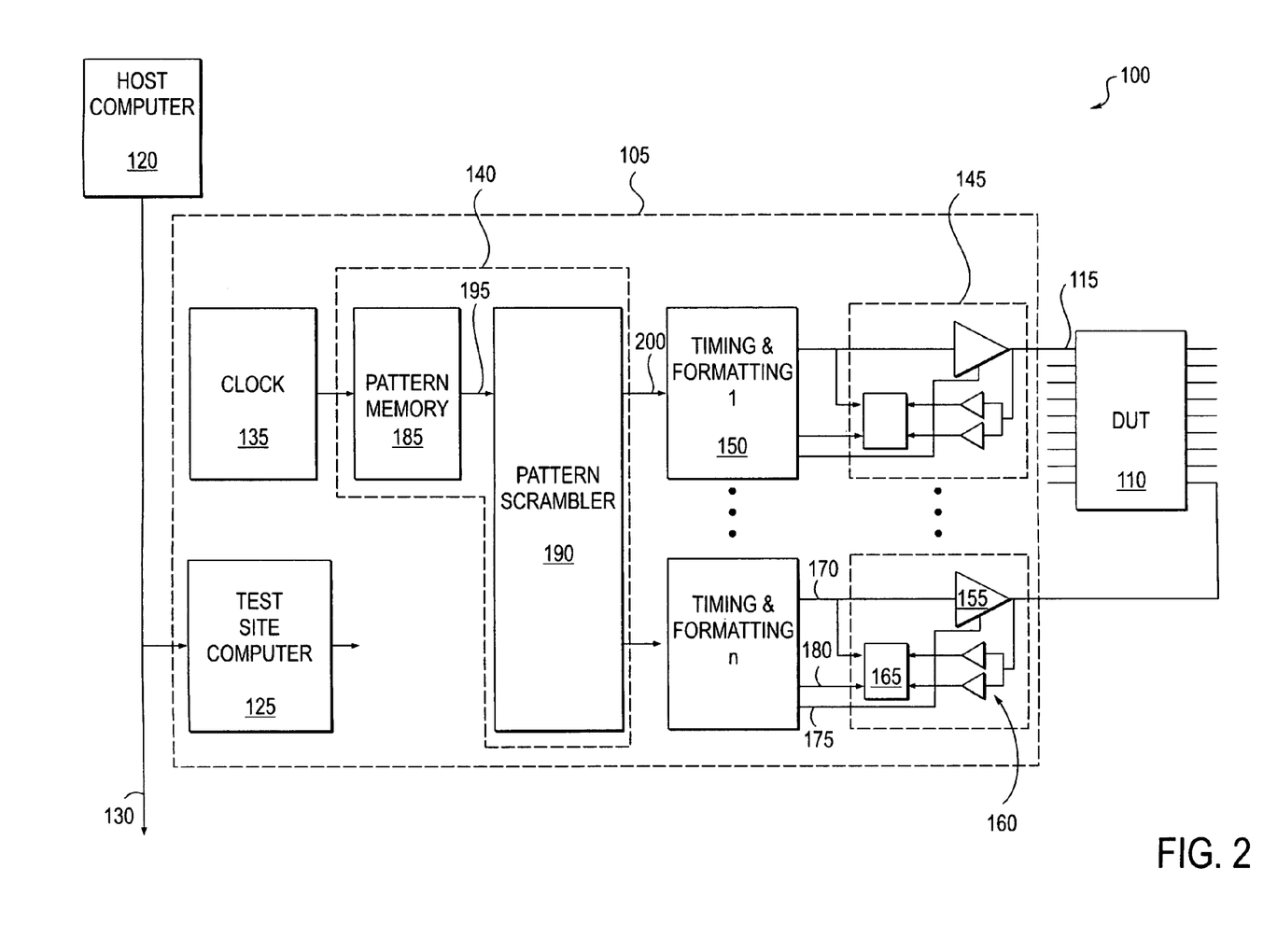
FIG. 2 is a block diagram of a test system having a single test site with a pattern generator having a pattern memory and pattern scrambler according to an embodiment of the present invention.

A test system according to the present invention will now be described with reference to FIG. 2. FIG. 2 is a block diagram of a test system 100 having a single apparatus or test site 105 for testing one or more devices under test (DUT 110) according to an embodiment of the present invention. By DUT 110 it is meant any electronic component, module, or an IC having logic circuits, memory arrays or both. DUT 110 can be a die, packaged part or can be one of a number of devices on a substrate. DUT 110 can be coupled to test system 100 via a number of pins 115 or via probes (not shown) contacting pads on the substrate (not shown). While shown as having only one test site 105, it will be appreciated that the test system 100 can include multiple test sites for parallel testing of a larger number of DUTs 110 than can be accommodated on a single test site, or for testing a number of DUTs 110 with a larger number of pins 115 than available on one or more test sites.

Referring to FIG. 2, test system 100 includes, in addition to test site 105, a general purpose host computer 120 or PC. Host computer 120 performs housekeeping functions such as downloading test programs to a test site computer 125 in test site 105, receiving results of device tests, and aiding in linking multiple test sites within a single test system, or linking multiple test systems (not shown) within a facility. Host computer 120 can be connected via network connection 130 to other test sites (not shown in this figure) as described infra. Host computer 120 can also be connected via an ethernet connection to a separate Local Area Network or a facility wide enterprise network (not shown) to track operation of test system 100 and/or results of device tests.

Generally, test site 105 includes, in addition to test site computer 125, a clock 135, a test signal source or pattern generator 140, a number of pin electronic (PE) circuits or channels 145, and a number of timing generators and format circuits (T/Fs 150) coupled between the pattern generator and the PE channels. The test site computer 125 is a special purpose computer that couples to every other component or element in test site 105 for controlling the operation thereof.

Clock 135 provides a timing or clock signal having a clock cycle to pattern generator 140 and T/Fs 150.

Generally, each PE channel 145 receives a 3-bit portion of the test pattern or signal from the pattern generator 140 through the T/Fs 150, each 3-bit signal including a drive/expect data signal, a strobe control signal and an Input/Output (I/O) control signal. Some test systems decode these (typically) three bits into a different combination of eight PE control functions. Each PE channel 145 typically includes a PE driver 155 coupleable or capable of coupling signals to a pin 115 of DUT 110, a comparator 160 for comparing an output signal with an expected output signal, and an error logic circuit 165 for coupling results of the comparison back through the pattern generator 140 to an error capture memory (not shown) in the test site computer 125. Generally, PE driver 155 and comparator 160 are not active in the same PE channel 145 at the same time, since pin 115 is either receiving data or control signals or transmitting a result at a given time. PE channels 145 further include a data line 170 for coupling the drive/expect data signal from T/F 150 to PE driver 155 and error logic 165, an enable or control line 175 for coupling the I/O control signal from T/F 150 to the PE driver enabling it to apply the drive/expect data signal to a pin 115 of the DUT 110, and a strobe line 180 for coupling the strobe control signal to the error logic 165 to enable it.

In accordance with the present invention, the pattern generator 140 includes a pattern memory 185 and a pattern scrambler 190 coupled between the pattern memory and the T/Fs 150. The pattern memory 185 has memory for storing test patterns or vectors having a number of bits and a number of pattern memory outputs 195 for transmitting, coupling or outputting the test patterns to the DUT 110. The pattern scrambler 190 is connected to the pattern memory outputs 195 and has pattern scrambler outputs 200 connected to the T/Fs 150 to transmit or couple bits from one or more of the pattern memory outputs to one or more of the pins 115 on the DUT 110, to provide a test pattern or test vector to the DUT.

The pattern scrambler 190 is capable of coupling bits from any one of the pattern memory outputs 195 to any one or more PE channels 145 through the T/Fs 150. Thus, the pattern generator 140 of the present invention is able to provide a test pattern having a width of from 1 bit wide to a width equal to the number of the pattern memory outputs 195 or the number of PE channels 145, whichever is less. The test pattern has a corresponding depth or size depending on the capacity of the pattern memory 185. For example, if the pattern memory 185 is a memory array having n pattern memory outputs 195 and a capacity of m×n bits, the pattern scrambler can be programmed to provide test patterns having depths of from n×m bits with a width of 1 bit to depths of m bits with a width of n bits. Preferably, the pattern scrambler 190 is able to change the width, the depth, or both of test patterns provided to the DUT 110 "on the fly" or on a cycle-by-cycle basis for each clock cycle of the test system 100. More preferably, the pattern scrambler 190 is also capable of changing bits coupled to one or more of the pins 115 on a cycle-by-cycle basis without rewiring of the test site 105, the connection to the DUT 110 or extensive reprogramming of pattern generator 140.

Figure 3:
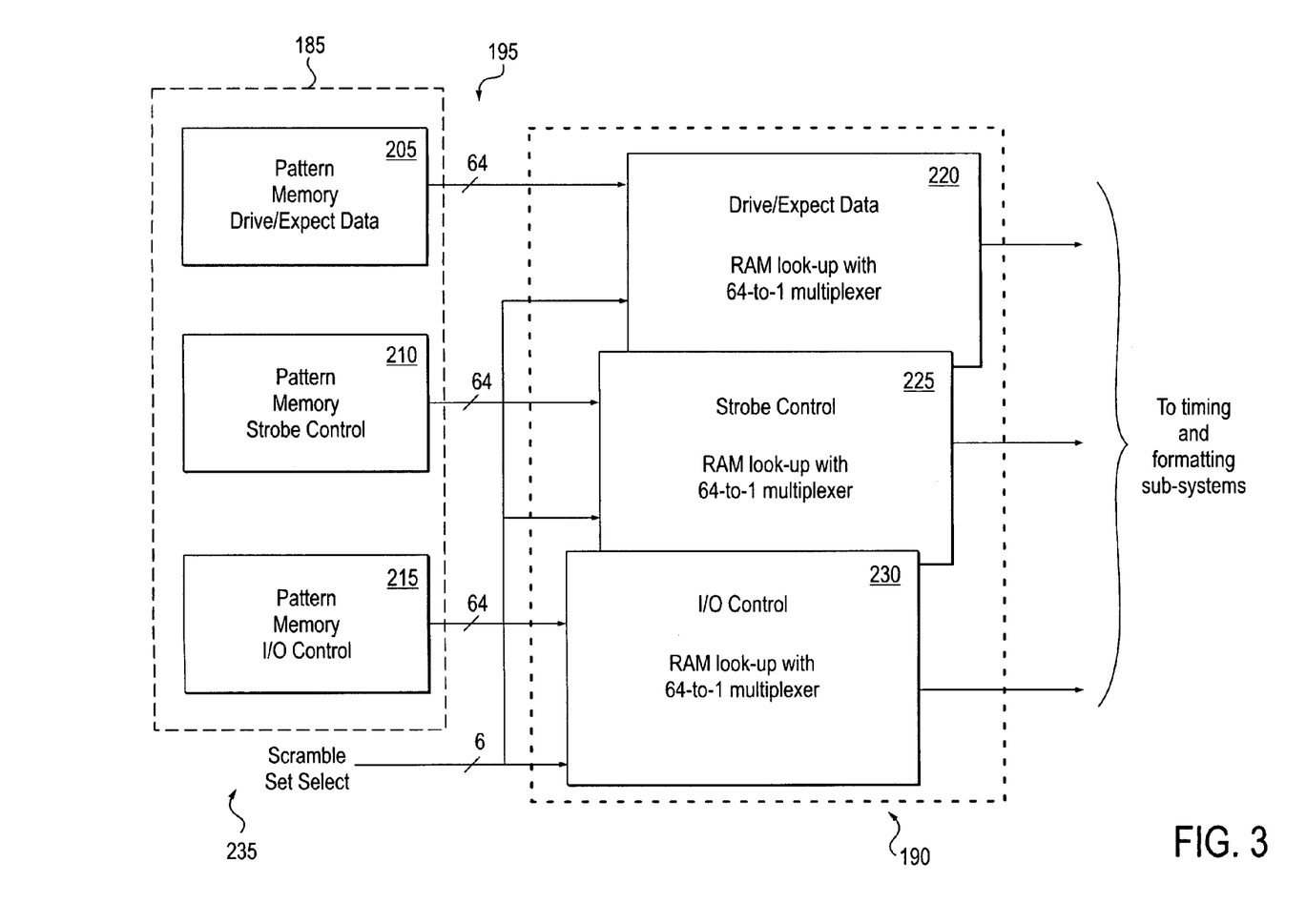
FIG. 3 is a partial block diagram of the test system of FIG. 2 showing a detailed block diagram of the pattern memory and a pattern scrambler according to an embodiment of the present invention.

Components or elements of the pattern generator 140 and the test site 105 will now be described in more detail with reference to FIGS. 3 through 5. FIG. 3 is a partial block diagram of the test system 100 of FIG. 2 showing details of the pattern memory 185 and a portion of the pattern scrambler 190 for a single PE channel according to an embodiment of the present invention. Referring to FIG. 3, the pattern memory 185 includes drive/expect data pattern memory 205, strobe control pattern memory 210, and I/O control pattern memory 215, for providing drive/expect data signals, strobe control signals, and I/O control signals, respectively, to the pattern scrambler via pattern memory outputs 195. The pattern scrambler 190 includes three switching elements or circuits, such as multiplexers, crossbar switches or switching fabric, for each PE channel 145 in the test site 105, and is capable of connecting any one of a predetermined number of pattern memory outputs 195 to a predetermined number of PE channels through an associated T/F 150. For example, in the embodiment shown in FIG. 3 the pattern scrambler 190 includes three 64-to-1 multiplexers for each one of 64 PE channels 145, including a drive/expect data multiplexer 220, a strobe control multiplexer 225 and an I/O control multiplexer 230. Thus, the multiplexers 220, 225, 230, associated with any given PE channel 145 are capable of selecting from the pattern memory 185 a 3-bit signal including a drive/expect data bit from any of 64 pattern memory outputs 195, a strobe control bit from any of 64 pattern memory outputs, and an I/O control bit from any of 64 pattern memory outputs. A scramble set select 235 controls which outputs 195 the pattern scrambler 190 couples to a particular PE channel 145 or T/F 150. In the example shown, the scramble set select 235 includes six lines connected in parallel to each of the multiplexers 220, 225, 230, to select any of the 64, or $2^6$, pattern memory outputs 195.

Figure 4:
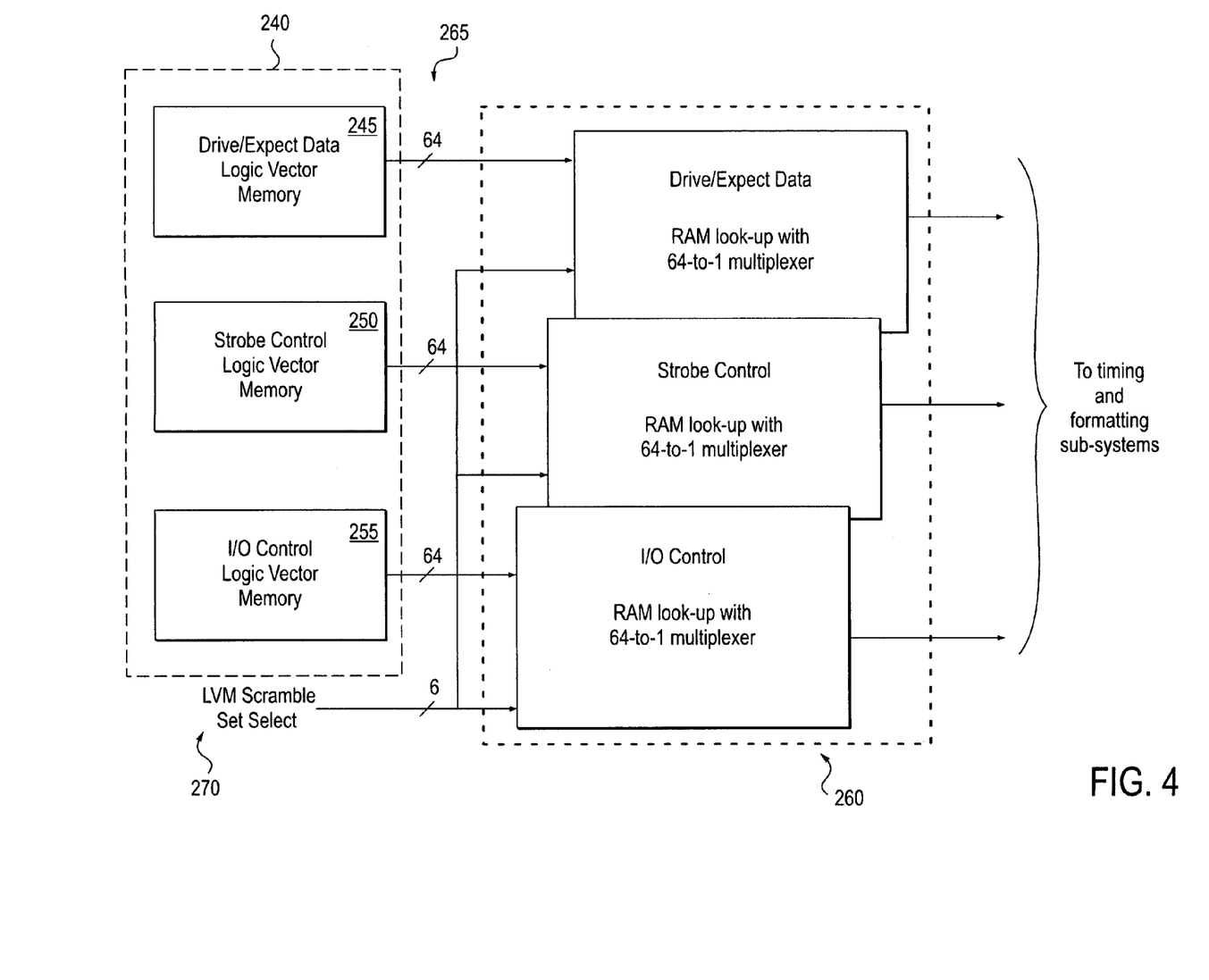
FIG. 4 is a partial block diagram of a test site with a logic vector memory (LVM) and a LVM scrambler according to an embodiment of the present invention.

In one embodiment, shown in FIG. 4, the pattern memory 190 is a logic vector memory (LVM 240) adapted to store logic vectors for testing logic circuits in the DUT 110, and includes drive/expect data LVM 245, strobe control LVM 250, and I/O control LVM 255. The pattern scrambler 190 is an LVM or vector scrambler 260 including multiple switching elements or circuits, such as multiplexers, crossbar switches or switching fabric, for each PE channel 145 in the test site 105, and is capable of connecting any one of a predetermined number of LVM outputs 265 to a predetermined number of PE channels through their associated T/F 150. An LVM scramble set select 270 controls which of the LVM outputs 265 the LVM scrambler 260 couples to a particular PE channel 145 or T/F 150.

Figure 5:
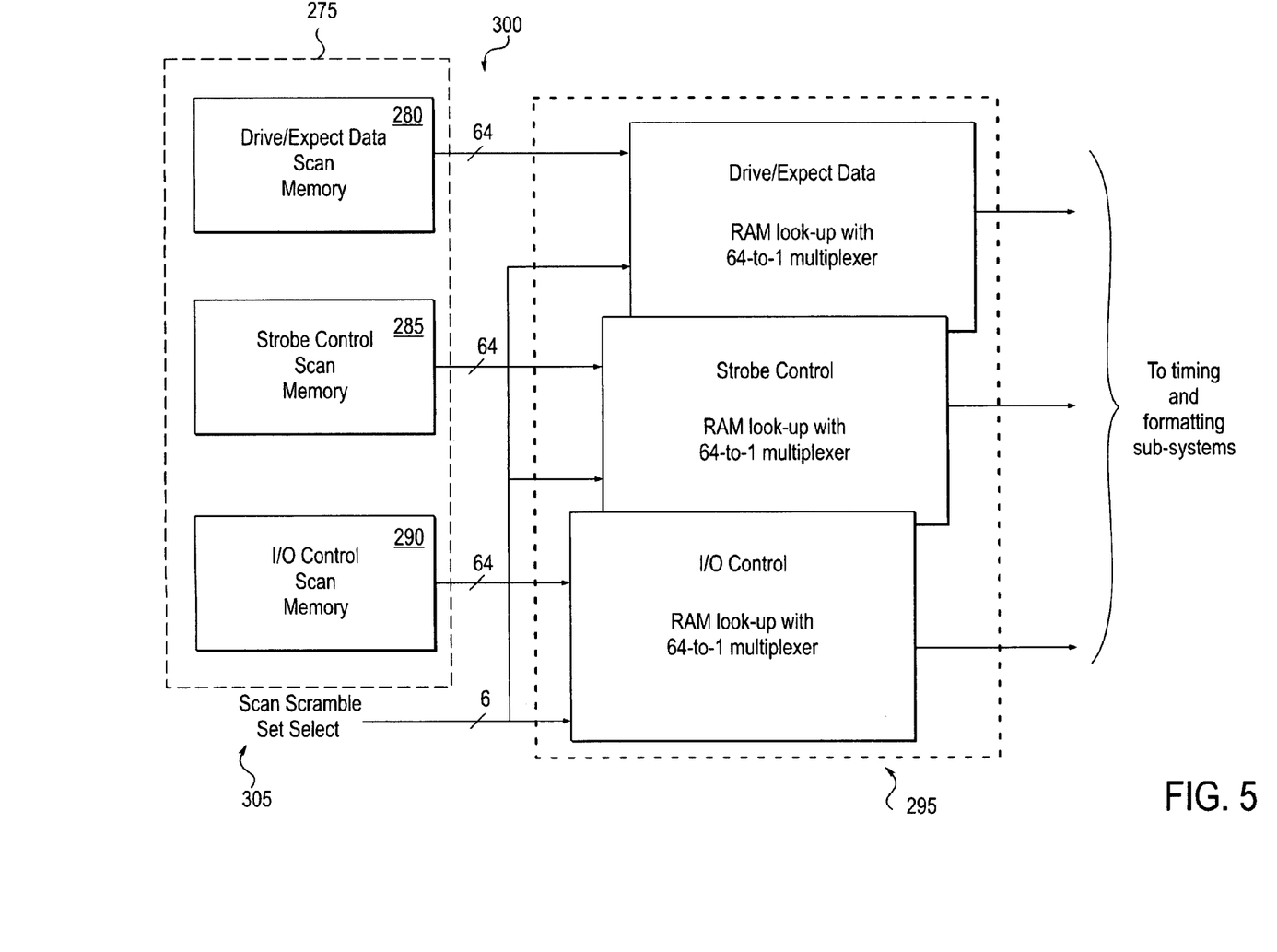
FIG. 5 is a partial block diagram of a test site with a scan memory and a scan scrambler according to an embodiment of the present invention.

In another embodiment, shown in FIG. 5, the pattern memory 190 is a scan memory 275 adapted to store scan vectors for serial type test interfaces or for structural test of the DUT 110, and includes drive/expect data scan memory 280, strobe control scan memory 285, and I/O control scan memory 290. The pattern scrambler 190 is a scan scrambler 295 including multiple switching elements or circuits, such as multiplexers, crossbar switches or switching fabric, for each PE channel 145 in the test site 105, and is capable of connecting any one of a predetermined number of scan outputs 300 to a predetermined number of PE channels through their associated T/F 150. A scan scramble set select 305 controls which scan outputs 300 the scan scrambler 295 couples to a particular PE channel 145 or T/F 150.

In a preferred embodiment, not shown, the pattern memory 185 is capable of being operated, partitioned or divided to simultaneously provide LVM 240 and a scan memory 275 for storing logic vectors and scan vectors respectively. Each vector includes a number of bits and has a width and a depth. The logic vectors stored in the LVM potion of the pattern memory 185 and the scan vectors stored in the scan memory portion need not have the same width and/or depth Generally, logic vectors are wide, often equal to the number of pins 115 on the DUT 110 or to the number of pins adapted to receiving parallel logic vector inputs. Scan memory 275 and the scan vectors stored therein are usually narrower, often only as wide as a few pins 115. In one version of this embodiment, the width and/or depth of the logic and scan vectors, and therefore the LVM 240 and scan memory 275, can be changed "on the fly" on a cycle-by-cycle basis.

In yet another embodiment, scan vectors are stored with logic vectors in the same pattern memory 185. In this case, the logic vectors and scan vectors are sent to the T/Fs 150 through a single pattern scrambler 190. The pattern scrambler 190 can map the logic vectors and scan vectors having different widths if required to different pins 115 or PE channels 145 if required.

Additional alternative embodiments of a test site 105 according to the present invention will now be described in more detail with reference to FIGS. 3 through 6.

Figure 6:
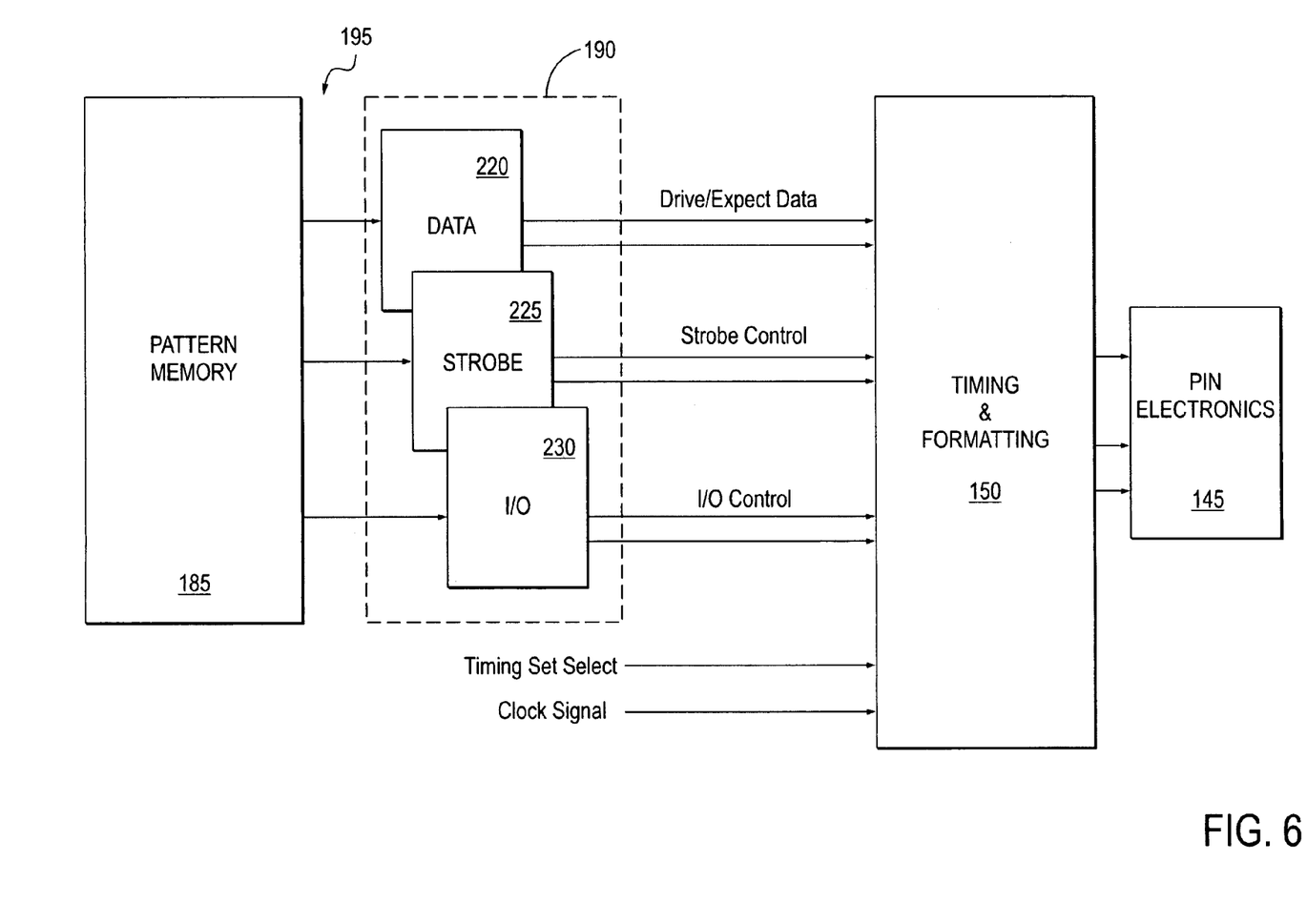
FIG. 6 is a partial block diagram of a test site having a pattern memory, a pattern scrambler, a timing and formatting circuit (T/F) and pin electronics channels (PEs) according to an embodiment of the present invention.

FIG. 6 is a partial block diagram of a test site 105 having a pattern memory 185, a pattern scrambler 190, a T/F 150 and a PE channel 145 with double data rate (DDR) pattern scrambling according to an embodiment of the present invention. Referring to FIG. 6, the pattern scrambler 190 includes multiple switching elements or circuits, such as multiplexers 220, 225, 230, as described above, for each PE channel 145 in the test site 105. However, unlike the embodiments described above, the pattern scrambler 190 is adapted to couple two 3-bit signals from among the plurality of pattern memory outputs 195 to the T/F 150 of any particular PE channel 145. The two 3-bit signals including two drive/expect data bits, two strobe control bits, and two I/O control bits.

In addition, T/F 150 also receives a clock signal 310 and a timing set select signal 320. The timing set select signal 320 enables the T/F to determine which of the two 3-bit signals, a primary bit or a DDR bit, to couple to the PE channel 145 during a particular portion of the clock cycle. The clock signal 310 enables the T/F to determine how long to couple the primary bit or the DDR bit to PE channel 145. It should be noted that the length or duration with which each 3-bit signal is applied to the PE channel 145 need not be equal, nor do the times of the transitions or switching of pattern memory outputs 195 need necessarily to correspond. Typically, the clock signal 310 includes a number of regular clock ticks or pulses and, in conjunction with the timing set select signal 315, inform the T/F 150 how pulses constitute a tester cycle. For example, the clock signal 310 can include pulses at a frequency of 100 MHz and the T/F 150 can be programmed or operated to count 100 pulses to provide a 1 microsecond tester cycle. Thus, the T/F 150 can switch the 3-bit signal coupled to associated PE channel 145 from 2 to many times a tester cycle, provided that sufficient bits are coupled to the T/F by pattern scrambler 190, and that timing set select signal 315 includes sufficient information to enable the T/F to determine which 3-bit signal to couple to the PE channel 145 during a particular portion of the clock cycle.

Figure 7:
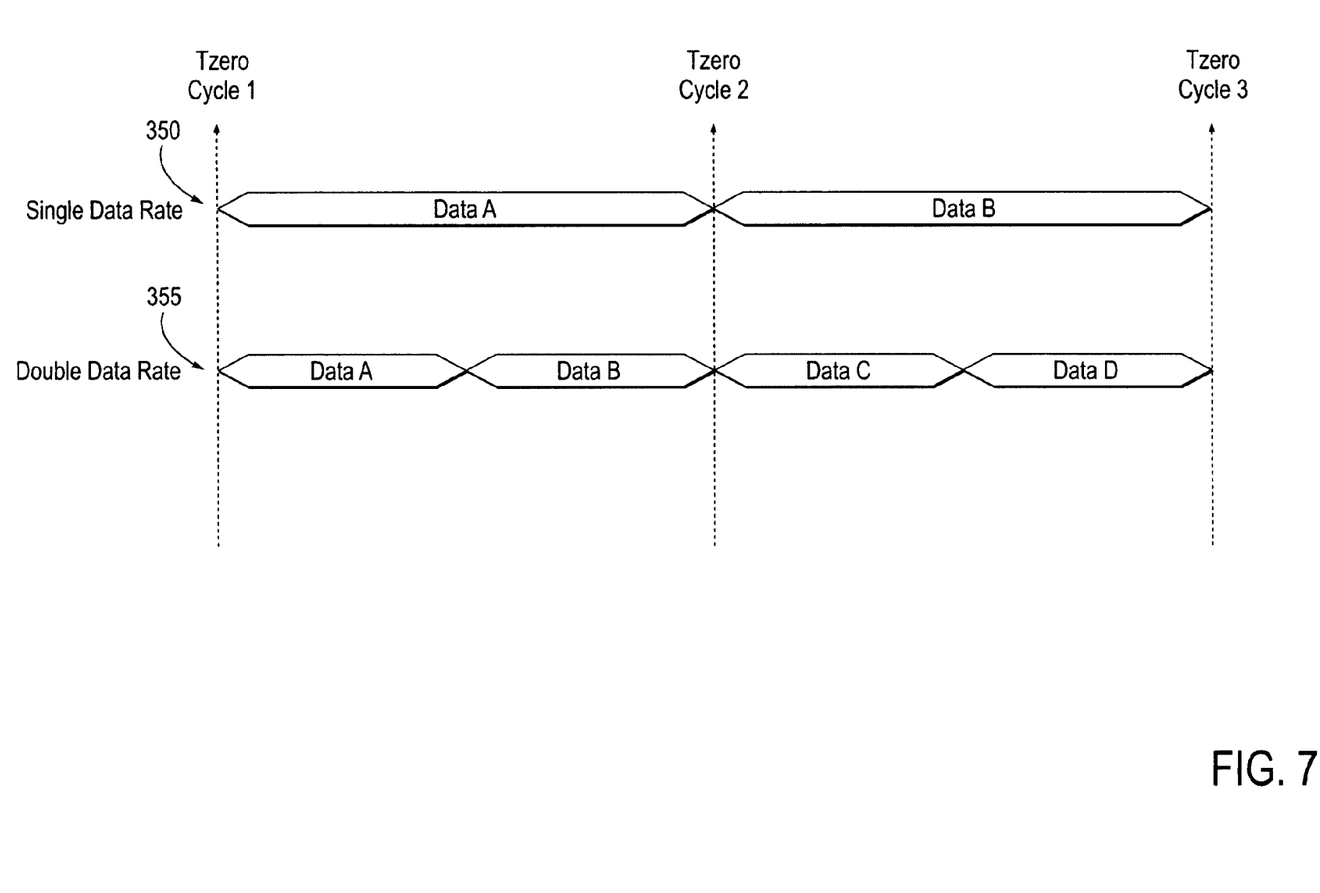
FIG. 7 is a timing diagram illustrating double data rate pattern scrambling according to an embodiment of the present invention.

An embodiment or a process or method for testing the DUT 110 at a frequency greater than that of the clock 135 will now be described with reference to FIG. 7. FIG. 7 is a timing diagram illustrating double data rate pattern scrambling according to an embodiment of the present invention.

Referring to FIG. 7, for a test system operating at a single data rate, shown by graph 350 in the top of FIG. 7, it is seen that a 3-bit test signal, DATA A is applied to a particular PE channel 145 at $T_{zero}$ of clock cycle 1 and continues to be applied uninterrupted for the entire clock cycle. At or near $T_{zero}$ of the clock cycle 2 another 3-bit test signal, DATA B, is applied uninterrupted for the entire clock cycle. Although, in this embodiment the 3-bit signal can be applied starting at different times during the clock cycle, including times interpolated between clock pulses or cycles, only one 3-bit signal can be coupled to a PE channel 145 during a clock cycle. In contrast, for the test system 100 shown in FIG. 6 two 3-bit signals can be applied to a PE channel 145 during a clock cycle, as shown in graph 355 in the lower half of FIG. 7. Referring to graph 355, it is seen that a first 3-bit signal, DATA A, can be coupled to a PE channel 145 at $T_{zero}$ of clock cycle 1, and a second 3-bit signal, DATA B, can be coupled to the pin at a later time, $T_{zero+n}$ as shown. It should be noted that the duration or length of time in a clock cycle during which each 3-bit signal is coupled to the PE channel 145 need not be equal and the first 3-bit signal can be applied at locations other than $T_{zero}$.

An alternative embodiment of a test system 100 including test site 105 with a pattern memory 185 and a pattern scrambler 190 according to the present invention will now be described with reference to FIG. 8.

Figure 8:
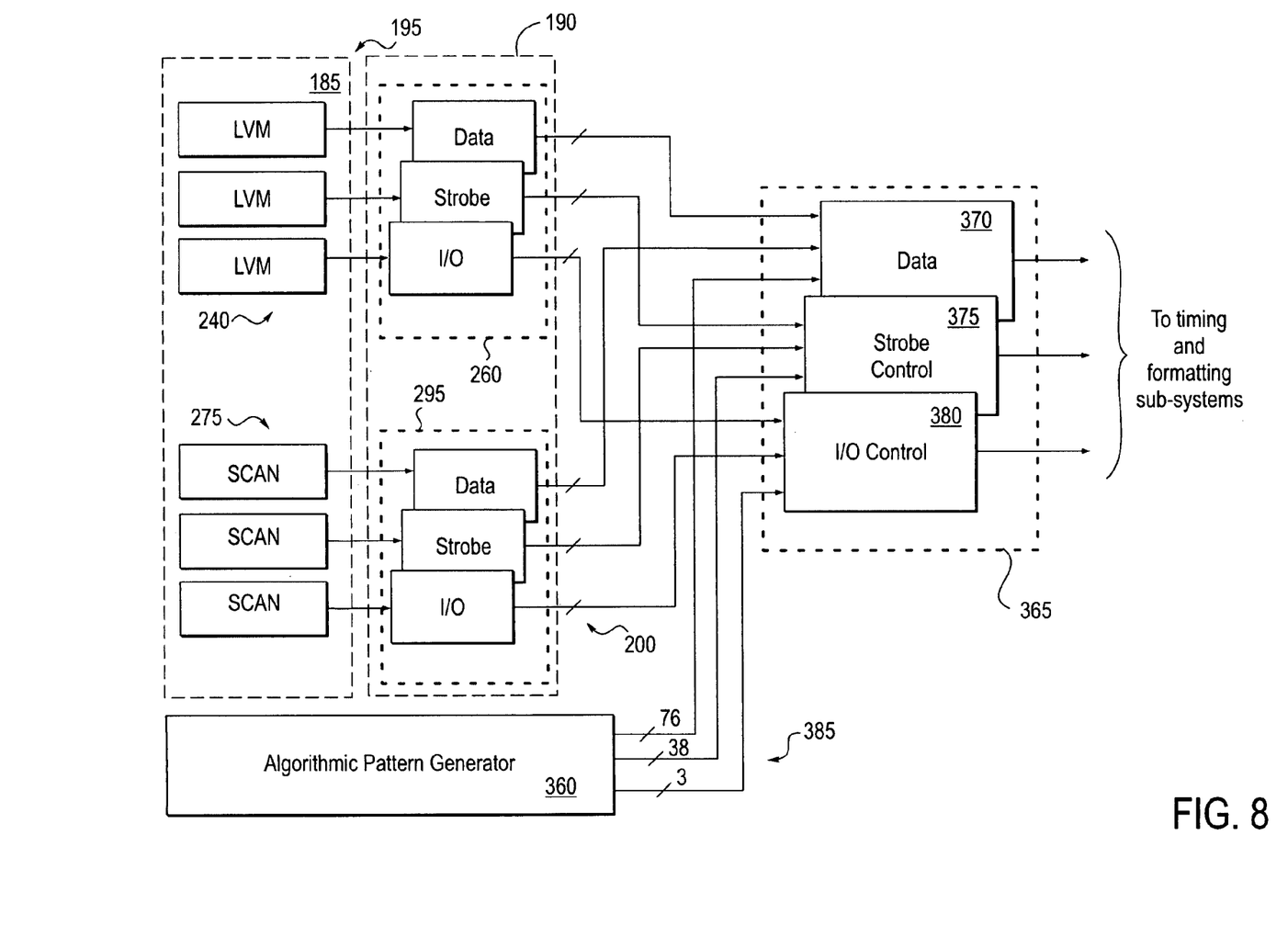
FIG. 8 is a partial block diagram of a test site having LVM, an LVM scrambler, scan memory, a scan scrambler, an algorithmic pattern generator and a pin scrambler to provide complete scrambling from three pattern resources according to an embodiment of the present invention.

FIG. 8 is a partial block diagram of a test site 105 having LVM 240, an LVM scrambler 260, scan memory 275, a scan scrambler 295, and showing the addition of an algorithmic pattern generator (APG) 360 and a pin scrambler 365 to provide complete scrambling from three pattern resources according to an embodiment of the present invention. Pin scramblers 365 and pin scrambling are described in commonly assigned, co-pending U.S. patent application Ser. No. 09/895,439, which is incorporated herein by reference.

Referring to FIG. 8, the pin scrambler 365 like the pattern scrambler 190, or LVM scrambler 260 and scan scrambler 295 as shown, includes multiple, preferably three, switching circuits or elements for each PE channel 145. In the embodiment shown, the pin scrambler includes three multiplexers 370, 375, 380, for coupling a three bit signal, including a data bit, a strobe control bit, and an I/O control bit, from the LVM 240, scan memory 275 or APG, to an associated PE channel through its' T/F 150. Generally, all outputs 385 of the APG 360 are coupled to the pin scrambler 365, while only a single 3-bit signal is coupled to the pin scrambler from the pattern scrambler 190 (not shown), or one 3-bit signal each from the LVM scrambler 260 and scan scrambler 295, as shown. The pin scrambler further receives a pin scramble set select (not shown) similar to the scramble set select, LVM scramble set select, and scan scramble set select described above to control which 3-bit signal the pin scrambler 365 couples to a particular T/F 150 or PE channel 145.

In the embodiment shown in FIG. 8, the pattern memory 185 is partitioned or divided to provide an LVM 240 and scan memory 275, and the pattern scrambler 190 is logically divided to provide LVM scrambler 260 and scan scrambler 295, as described above. It should be noted that while the LVM 240, LVM scrambler 260, scan memory 275 and scan scrambler 295 are shown as logical or virtual divisions of a single pattern memory 185 and pattern scrambler 190, each can be also be implemented as separate elements or circuits using discrete components or devices. The LVM scrambler 260 and scan scrambler 295 include multiple, preferably three, switching circuits or elements for each PE channel 145. Generally, the LVM and scan scramblers 260, 295, include one multiplexer dedicated to drive/expect data, one to strobe control, and one to I/O control, as shown. The LVM and scan scramblers 260, 295, are each adapted to couple any of a number of 3-bit signals from the outputs 195 from LVM 240 and scan memory 275, respectively, to the pin scrambler 365. For example, for a test site 105 having 64 PE channels 145, the LVM and scan scramblers 260, 295, can comprise three 64 to 1 multiplexers for each PE channel to each couple a 3-bit signal to the pin scrambler 365. Although not shown, it will be appreciated that the LVM scrambler 260 and the scan scrambler 295 also receive a LVM scramble set select signal and a scan scramble set select signal to select or control which 3-bit signal is coupled to the pin scrambler 365 for a particular T/F 150 or PE channel 145. As noted above, all outputs 385 from the APG 360 are coupled directly to the pin scrambler 365. For the example given, these outputs 385 include seventy-six data lines or bits coupled to the data multiplexer 370 of each PE channel 145, thirty-eight strobe control lines or bits coupled to the strobe control multiplexer 375, and three I/O control lines or bits coupled to the I/O control multiplexer 380.

In another alternative embodiment, the LVM scrambler 260, scan scrambler 295 and pin scrambler 365 are adapted to enable the pin scrambler to couple two 3-bit signals to the T/F 150 for each PE channel 145. The T/Fs 150 further receive a timing set select (not shown) that enables it to determine which of the two 3-bit signals, a primary bit or a DDR bit, to couple to the PE channel 145 during a particular portion of the clock cycle. Preferably, the pattern scrambler 190 is programmed and the T/F 150 operated to switch 3-bit signals coupled from the pattern memory outputs 195 to any given PE channel 145 at least twice in each clock cycle, thereby providing test patterns to the DUT 110 at a rate at least twice that of the clock cycle.

Alternatively, the test system 100 can further include a pin scrambler 365 between the pattern scrambler 190 and the T/Fs 150 as shown in FIG. 8, and the scan memory 275 can be used to store logic vectors to provide a DDR vector memory. Logic vectors from the LVM 240 are selected or coupled to the PE channel 145 in a first part of the clock cycle using the pattern scrambler 190, and logic vectors from the scan memory 275 are selected in the second part of the clock cycle. This yields DDR logic vectors using two single speed scramblers, i.e., the pattern scrambler 190 composed of single data rate scramblers 260 and 295.

Figure 9:
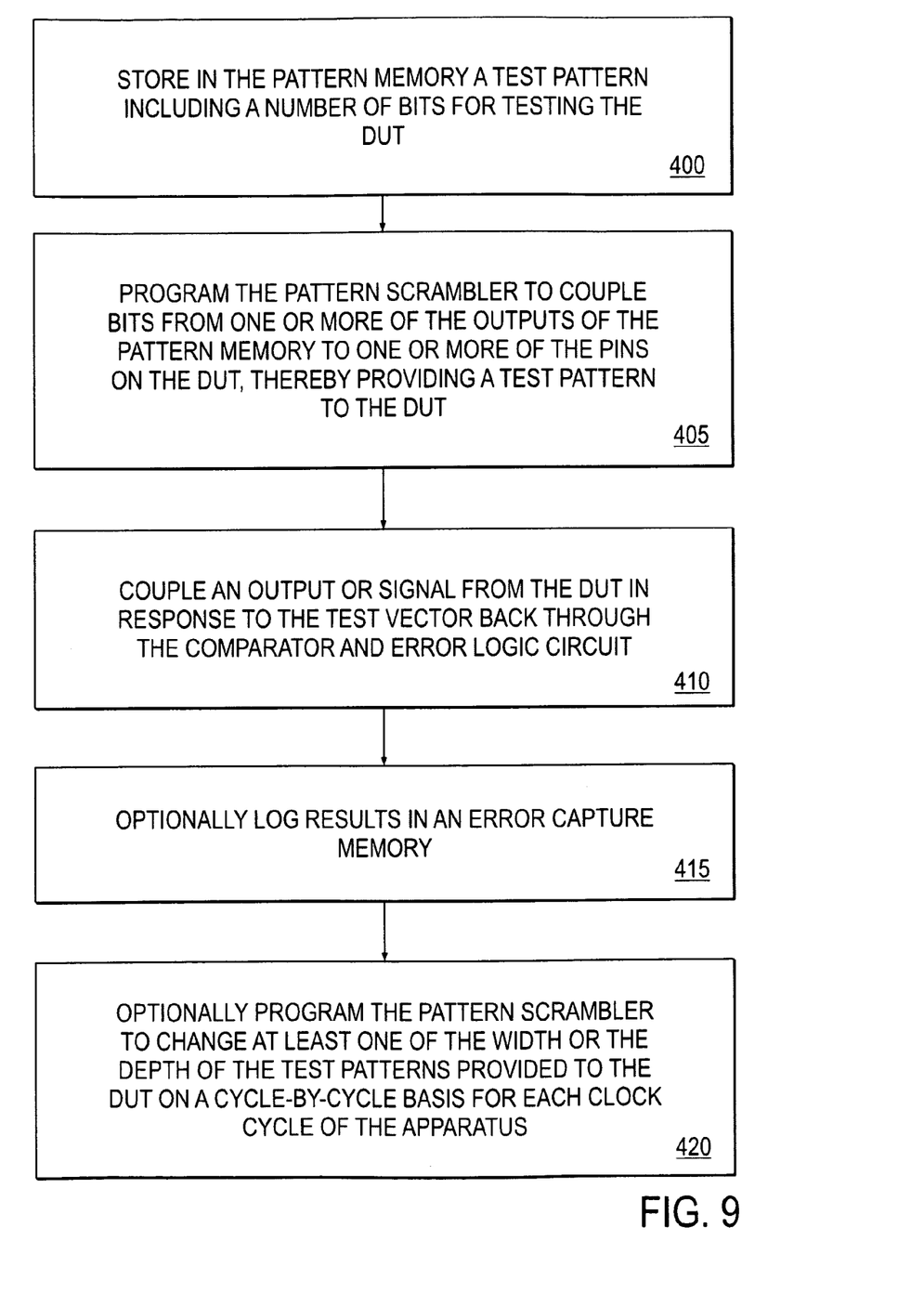
FIG. 9 is a flowchart of a method for operating a test system having a pattern generator having a pattern memory and pattern scrambler according to an embodiment of the present invention.

A method or process for testing a DUT 110 using a test system 100 having a pattern memory 185 with a number of outputs 195 for outputting a number of bits to test the DUT, and a pattern scrambler 190 coupled between the outputs 195 and a number of pins 115 on the DUT will now be described with reference to FIG. 9. FIG. 9 is a flowchart showing a process for operating the test system 100 according to an embodiment of the present invention. Referring to FIG. 9, the process begins by storing a test pattern or vector comprising a number of bits for testing the DUT 110 in the pattern memory 185 (step 400). Generally, this is accomplished by loading a test pattern from the test site computer 125 to the pattern memory 185 via a computer bus (not shown). Next, the pattern scrambler 190 is programmed or operated to couple bits from one or more of the outputs 195 of the pattern memory 185 to one or more of the pins 115 on the DUT 110, thereby providing a test pattern to the DUT (step 405). The test pattern can have a width of from 1 bit to a width equal to the number of the pattern memory outputs 195, PE channels 145 or the pins 115 on the DUT 110, and a depth of from n×m bits, where the capacity of the pattern memory 185 is n×m bits, to m bits. Finally, an output or signal from the DUT 110 generated in response to the test vector is coupled back through the comparator 160 and error logic circuit 165 to error processing circuitry (step 410). Optionally, results are logged in an error capture memory (step 415). The pattern scrambler 190 may also be reprogrammed to change at least one of the width or the depth of the test patterns provided to the DUT 110 on a cycle-by-cycle basis for each subsequent clock cycle of the apparatus (step 420).

In one embodiment, the pattern memory 185 is capable of being operated, divided or partitioned to simultaneously provide LVM 240 and scan memory 275, and the step of storing bits in the pattern memory, 400, involves storing in the LVM logic vectors, and storing in the scan memory scan vectors. As noted above, the logic vectors and the scan vectors need not have the same width and/or depth.

In another embodiment, the process further involves the step of programming the pattern scrambler 190 to change at least one of the width or the depth of the test patterns provided to the DUT 110 on a cycle-by-cycle basis for each clock cycle of the test system 100 (step 415).

In yet another embodiment, the process further involves the step of programming the pattern scrambler 190 to provide two 3-bit signals or two bits, including a primary bit and a DDR bit to each T/F 150 and operating the T/F to switch or change signals or bits coupled to one or more of the pins on the DUT 110 on a cycle-by-cycle basis for each clock cycle of the test system 100 (step 420). In one version of this embodiment, the step of programming or operating the pattern scrambler 190, 405, involves programming the pattern scrambler and operating the T/F 150 to switch bits coupled from any one or more of the pattern memory outputs 195 to any one of the pins 115 on the DUT 110 at least twice in each clock cycle, thereby providing test patterns to the DUT at a rate at least twice that of the clock cycle.

The advantages of the test system and method of the present invention include any one or all of the following:

(i) increased efficiency and utilization of test system resources by maximizing the available storage space in pattern memory for a test vector of a given width;

(ii) capability to quickly and easily tailor the aspect ratio of available pattern memory based on a width of required test vectors;

(iii) ability to change the aspect ratio of available pattern memory on a cycle-by-cycle basis;

(iv) capability of routing any output from the pattern memory to any PE channel;

(v) ability to change the routing of any output from the pattern memory to any PE channel on a cycle-by-cycle basis;

(vi) capability of changing the test vector applied from any output from the pattern memory to any PE channel at a rate greater than once in a clock cycle;

(vii) ability to route any output to more than one PE channel (allowing multiple identical DUTs to be tested in parallel. This has the added effect of increasing the memory depth per DUT); and (viii) ability to split each 3-bit LVM or scan memory output and send the Data bit to one or more DUT pins and the Strobe Control and I/O Control bits as a pair to one or more DUT pins that are different than those being sent the Data bit.

It is to be understood that even though numerous characteristics and advantages of certain embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed.

What is claimed is:

1. An apparatus for testing a device under test (DUT) having a plurality of pins, the apparatus comprising:
   a clock having a clock cycle;
   a plurality of pin electronics channels (PEs) capable of coupling to the plurality of pins on the DUT;
   a plurality of timing and format circuits (T/Fs) each capable of mapping a signal to one of the plurality of PEs;
   a pattern memory capable of storing a number of bits for testing the DUT, the pattern memory having a plurality of outputs capable of outputting the bits to test the DUT; and
   a pattern scrambler coupled between the plurality of outputs and the plurality of T/Fs, the pattern scrambler capable of being programmed to couple bits from any one or more of the plurality of outputs to any one or more of the plurality of T/Fs, to provide a test pattern to the DUT having a programmable width.

2. An apparatus according to claim 1, wherein the pattern memory has n outputs and a capacity of m x n bits, and wherein the pattern scrambler is capable of being programmed to provide test patterns having a width of from 1 bits to n bits and a depth of from n x m bits to a depth of m bits.

3. An apparatus according to claim 2, wherein the pattern scrambler is capable of changing at least one of the width or the depth of the test patterns provided to the DUT on a cycle-by-cycle basis for each clock cycle of the test system.

4. An apparatus according to claim 1, wherein the pattern scrambler is capable of coupling bits from any one of the plurality of outputs to any one of the plurality of PEs, and wherein the pattern scrambler is capable of changing bits coupled to one or more of the plurality of PEs on a cycle-by-cycle basis for each clock cycle of the test system.

5. An apparatus according to claim 1, wherein the pattern memory is capable of being operated to simultaneously provide a logic vector memory (LVM) for storing logic vectors of a number of bits and having a width and a depth, and a scan memory for storing scan vectors of a number of bits and having a width and a depth.

6. An apparatus according to claim 5, wherein logic vectors stored in the LVM and the scan vectors stored in the scan memory comprise different widths.

7. A pattern generator for testing at least one device under test (DUT) having a plurality of pins, the pattern generator comprising:
   a pattern memory capable of storing a number of bits for testing the DUT, the pattern memory having a plurality of outputs capable of outputting the bits to test the DUT; and
   a pattern scrambler coupled between the plurality of outputs and the plurality of pins on the DUT, the pattern scrambler capable of being programmed to couple bits from any one or more of the plurality of outputs to any one or more of the plurality of pins on the DUT, to provide a test pattern to the DUT having a programmable width.

8. A pattern generator according to claim 7, wherein the pattern memory has n outputs and a capacity of m×n bits, and wherein the pattern scrambler is capable of being programmed to provide test patterns having a width of from 1 bit to n bits and a depth of from n×m bits to a depth of m bits.

9. A test system comprising a pattern generator according to claim 8, the test system further comprising a clock having a clock cycle, and wherein the pattern scrambler is capable of changing at least one of the width or the depth of the test patterns provided to the DUT on a cycle-by-cycle basis for each clock cycle of the test system.

10. A pattern generator according to claim 7, wherein the pattern scrambler is capable of being programmed to couple bits from each one of the plurality of outputs to one or more of the plurality of pins on one or more DUTs.

11. A test system comprising a pattern generator according to claim 10, the test system further comprising a clock having a clock cycle, and wherein the pattern scrambler is capable of changing bits coupled to one or more of the plurality of pins on one or more DUTs on a cycle-by-cycle basis for each clock cycle of the test system.

12. A pattern generator according to claim 7, wherein the pattern scrambler is capable of being operated to simultaneously provide a logic vector memory (LVM) for delivering logic vectors of a number of bits and having a width and a depth, and a scan memory for delivering scan vectors of a number of bits and having a width and a depth.

13. A pattern generator according to claim 12, wherein logic vectors delivered from the LVM and the scan vectors delivered from the scan memory comprise different widths.

14. A test system comprising a pattern generator according to claim 12, the test system further comprising a clock having a clock cycle, and wherein the width of the logic vectors delivered from the LVM and the scan vectors delivered from the scan memory can be changed by the pattern scrambler on a cycle-by-cycle basis for each clock cycle of the test system.

15. A pattern generator according to claim 7, wherein the pattern scrambler is capable of being programmed to couple a data bit of one of the plurality of outputs, output n, to one or more of the plurality of pins on the DUT, while strobe and I/O control bits of output n are coupled to one or more of the plurality of pins on the DUT, different from the one or more of the plurality of pins on the DUT to which the data bit is coupled, and wherein the I/O control bit is capable of being used as an expect data bit on the one or more of the plurality of pins on the DUT to which it is coupled.

16. A test system comprising a pattern generator according to claim 7, the test system further comprising a clock having a clock cycle, and wherein the pattern scrambler is capable of switching bits from any one of the plurality of outputs coupled to any one of the plurality of pins on the DUT at least twice in each clock cycle, whereby test patterns are provided to the DUT at a rate at least twice that of the clock cycles.

17. A method for testing a device under test (DUT) using a test system including a pattern memory having a plurality of outputs equal to n, and a pattern scrambler coupled between the plurality of outputs and a plurality of pins on the DUT, the method comprising steps of:

storing a number of bits for testing the DUT in the pattern memory; and programming the pattern scrambler to select, for each pin of the DUT, one or more bits from all of the plurality of outputs to be coupled to one or more of the plurality of pins on the DUT, and to provide a test pattern to the DUT having a programmable width.

18. A method according to claim 17, wherein the pattern memory has a capacity of m×n bits, and wherein the step of programming the pattern scrambler comprises the step of programming the pattern scrambler to provide test patterns having a width of from 1 bit to n bits and a depth of from n×m bits to a depth of m bits.

19. A method according to claim 18, wherein the test system further comprises a clock having a clock cycle, and wherein the step of programming the pattern scrambler comprises the step of programming the pattern scrambler to change at least one of the width or the depth of the test patterns provided to the DUT on a cycle-by-cycle basis for each clock cycle of the test system.

20. A method according to claim 17, wherein the test system further comprises a clock having a clock cycle, and wherein the pattern scrambler is capable of coupling bits from any one of the plurality of outputs to any one of the plurality of pins on the DUT, and wherein the step of programming the pattern scrambler comprises the step of programming the pattern scrambler to change bits coupled to one or more of the plurality of pins on the DUT on a cycle-by-cycle basis for each clock cycle of the test system.

21. A method according to claim 17, wherein the pattern memory is capable of being operated to simultaneously provide a logic vector memory (LVM) and a scan memory, and wherein the step of storing a number of bits for testing the DUT in the pattern memory comprises the step of storing in the LVM logic vectors of a number of bits and having a width and a depth, and storing in the scan memory scan vectors of a number of bits and having a width and a depth.

22. A method according to claim 21, wherein the step of storing a number of bits for testing the DUT in the pattern memory comprises the step of storing LVM vectors and the scan vectors having different widths.

23. A method according to claim 11, wherein the test system further comprises a clock having a clock cycle, and wherein the step of programming the pattern scrambler comprises the step of programming the pattern scrambler to switch bits from any one of the plurality of outputs coupled to any one of the plurality of pins on the DUT at least twice in each clock cycle, whereby test patterns are provided to the DUT at a rate at least twice that of the clock cycles.

* * * * *